United States Patent
Hauhe et al.

(10) Patent No.: US 7,978,145 B2
(45) Date of Patent: Jul. 12, 2011

(54) RECONFIGURABLE FLUIDIC SHUTTER FOR SELECTIVELY SHIELDING AN ANTENNA ARRAY

(75) Inventors: Mark Hauhe, Hermosa Beach, CA (US); Clifton Quan, Hermosa Beach, CA (US); Sean Costello, Redondo Beach, CA (US); Jim Vaught, Rancho Palos Verdes, CA (US)

(73) Assignee: Raytheon Company, Waltham, MA (US)

( * ) Notice: Subject to any disclaimer, the term of this patent is extended or adjusted under 35 U.S.C. 154(b) by 48 days.

(21) Appl. No.: 12/620,991

(22) Filed: Nov. 18, 2009

(65) Prior Publication Data

US 2011/0115686 A1    May 19, 2011

(51) Int. Cl.
*H01Q 1/52* (2006.01)
(52) U.S. Cl. ................................. 343/841; 343/872
(58) Field of Classification Search .................. 343/841, 343/872; 455/575.5
See application file for complete search history.

(56) References Cited

U.S. PATENT DOCUMENTS

| | | | |
|---|---|---|---|
| 5,014,022 A | 5/1991 | Wolfson et al. | |
| 5,777,586 A * | 7/1998 | Luxon et al. | 343/702 |
| 6,674,340 B2 | 1/2004 | Quan et al. | |
| 7,262,734 B2 | 8/2007 | Wood | |
| 7,612,727 B2 * | 11/2009 | Schwenke | 343/713 |
| 2004/0246194 A1 * | 12/2004 | Usami et al. | 343/872 |

OTHER PUBLICATIONS

Miners, A. et al., "Cooling of High-Power-Density Microdevices Using Liquid Metal Coolants", Applied Phys. Letts., vol. 85, No. 3 (2004).
Ghoshal, U., et al., "High-Performance Liquid Metal Cooling Loops", 21st IEEE Semi-Term Symposium (2005).
Qpedia, "Liquid Metal Cooling System", (Jun. 2008).

* cited by examiner

*Primary Examiner* — Tan Ho
(74) *Attorney, Agent, or Firm* — Pillsbury Winthrop Shaw Pittman LLP (57) ABSTRACT

A reconfigurable fluidic shutter for selectively shielding an antenna array includes a first surface and second surface spaced apart and defining a cavity; and a pump configured to pump liquid that attenuates electromagnetic radiation, such as a liquefied metal or alloy composition, into and out of the cavity. The first and second surface are transparent to electromagnetic radiation, for instance, microwave or other RF radiation.

21 Claims, 13 Drawing Sheets

Fig. 1A (Conventional)

Fig. 1B (Conventional)

Fig. 2A (Conventional)

Fig. 2B (Conventional)

RECONFIGURABLE FLUIDIC SHUTTER FOR SELECTIVELY SHIELDING AN ANTENNA ARRAY

BACKGROUND

The application generally relates to antenna systems, and in particular, a reconfigurable microwave fluidic shutter for selectively shielding an antenna array.

Active array antenna technologies for space, airborne, and ground systems are in wide use including multi-layered panel arrays using thin lightweight and conformal active array antennas for airborne platforms. Active array antennas for platforms such as unmanned airborne vehicles (UAVs) require increased reconfigurability to enhance performance, tunable frequency bandwidth, polarization, and signature. Typically, this may be accomplished with diode switches and mechanical actuators which increase power consumption and reduce reliability, respectively.

Figure 1A:
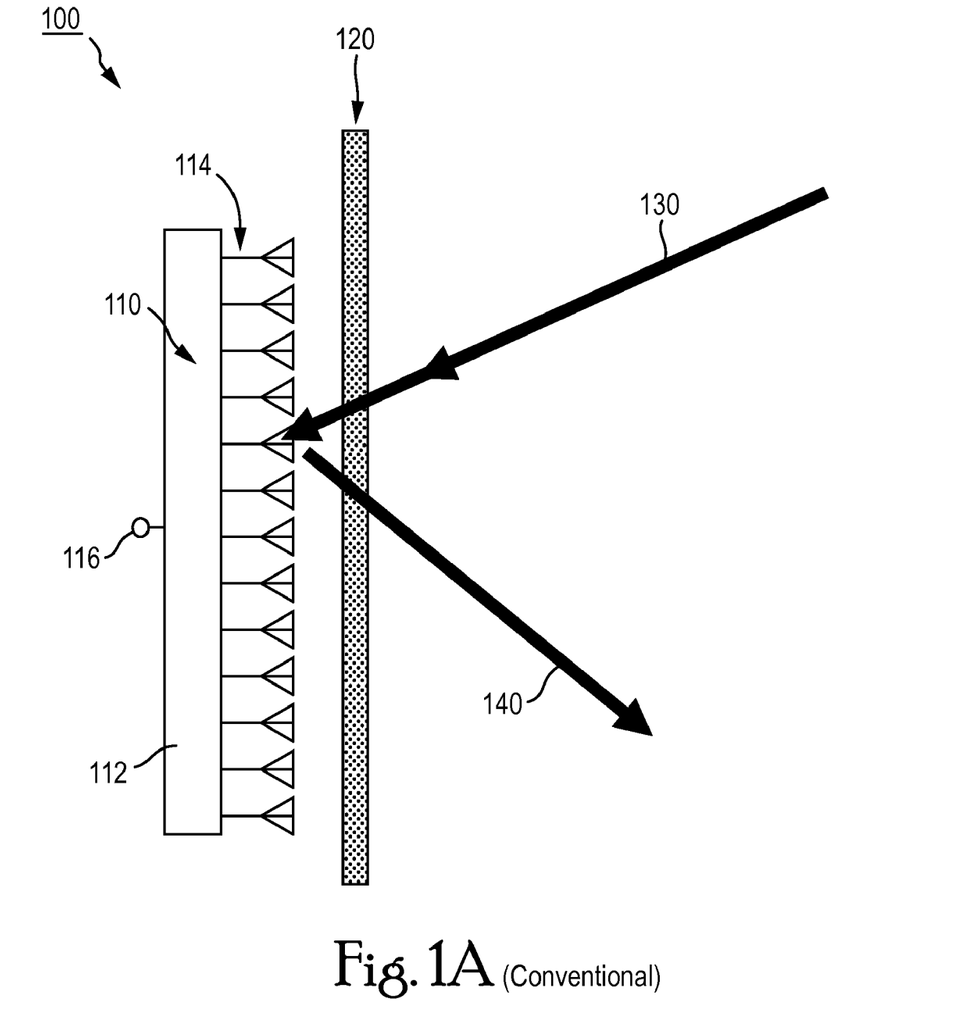
FIGS. 1A, 1B, 2A and 2B illustrate conventional active antenna array assemblies.

FIG. 1A illustrates a conventional active antenna array assembly 100. Assembly 100 generally include array antenna 110 having array antenna radio frequency (RF) feed 112, array of antenna radiating elements 114, and input/output 116. Assembly 100 also includes protective enclosure (also known as a radome) 120. Radomes are designed to be transparent to RF signals received and/or reflected by the antenna. Radome 120 can be designed as a solid sheet of dielectric material.

Figure 1B:
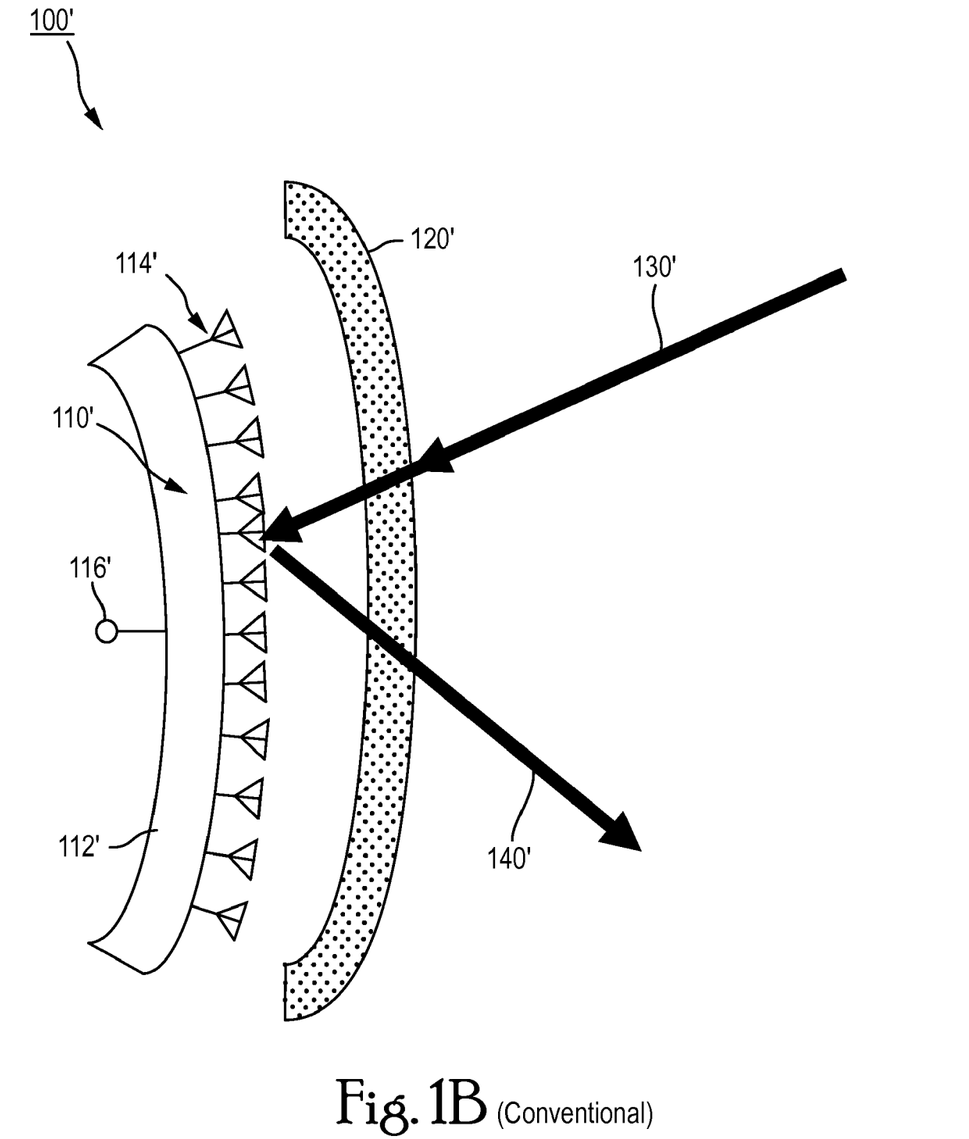

Radome 120 is structurally configured to protect the antenna surfaces from the environment (e.g., wind, rain, ice, sand, ultraviolet light, etc.). Radome 120 may be generally formed of a dielectric material that is transparent to received electromagnetic signals 130 or transmitted and/or reflected signals 140 by antenna array 112. FIG. 1B illustrates a similar active antenna array assembly 100', but having a curved array antenna 110' and curved radome 120'. As shown, radome 120' may be formed of a solid sheet of dietetic material.

Figure 2A:
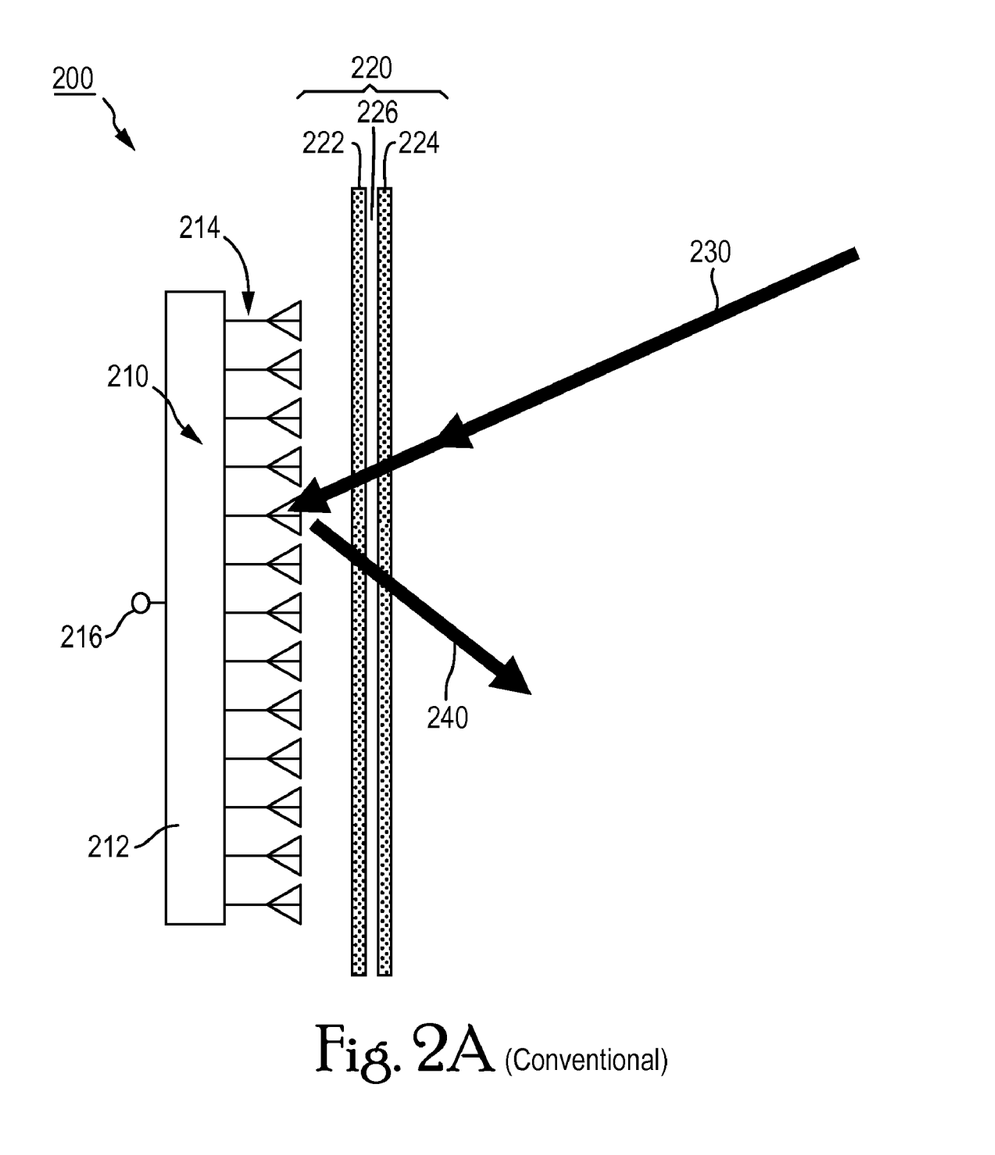
Figure 2B:
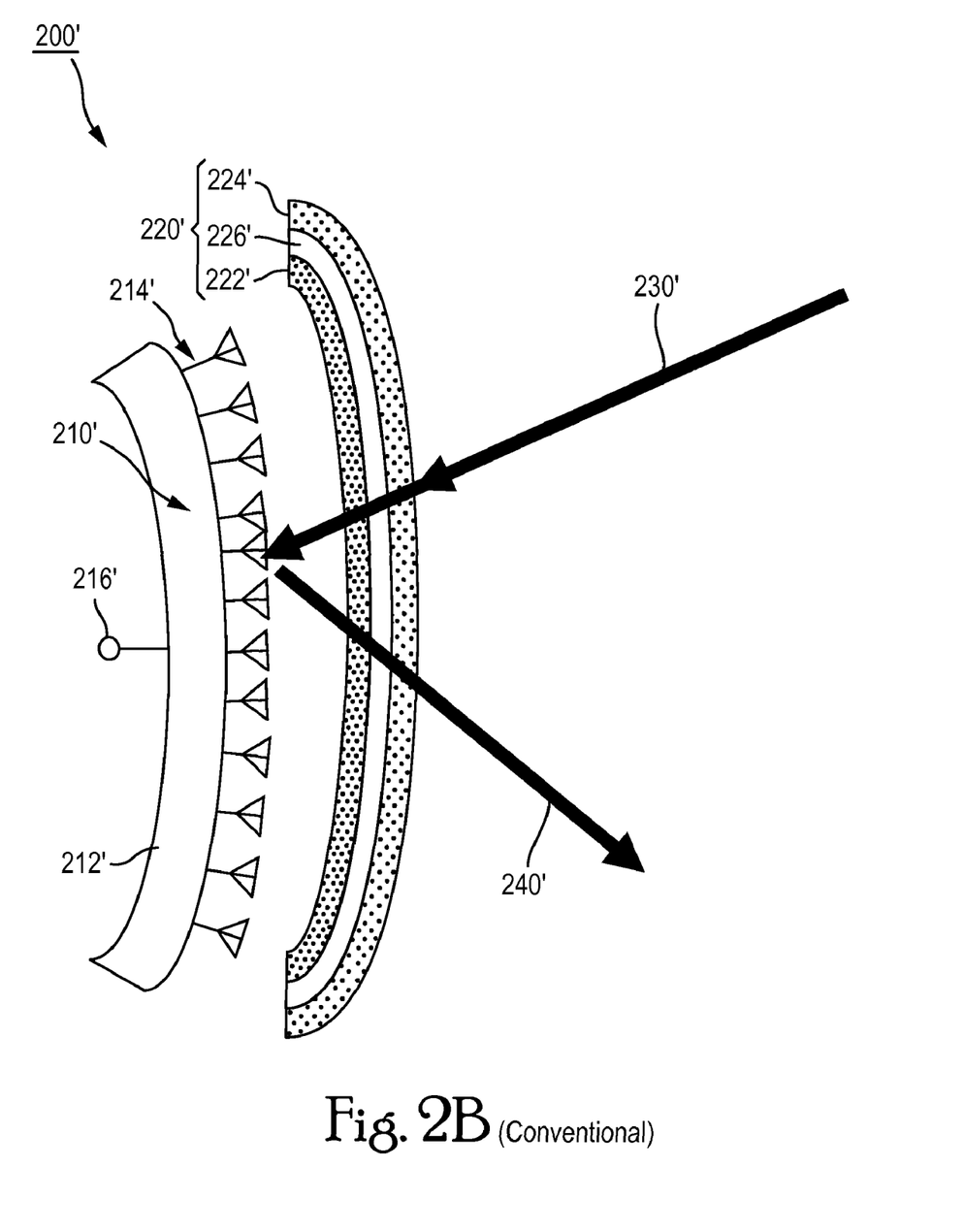

FIG. 2A illustrates another conventional active antenna array assembly 200. Radome 220 is constructed of multiple dielectric layers 222, 224. Dielectric sheets 222, 224 may be fused together to form thin cavity 226 therebetween which is filled with air. While two dielectric layers 222, 224 are shown, additional layers may also be conventionally provided so as to define multiple spaces. FIG. 2B illustrates a similar conventional active antenna array assembly 200', but having a curve array antenna 210' and a curved radome 220'.

Typically, a metal cover (not shown) may be placed over the radome or sandwiched between the two dielectrics to prevent outside RF signal from entering the antenna and reflecting off the antenna when the antenna is not in operation. The metal cover is removed when the antenna is ready to operate. This process may be performed manually and thus, is not efficiently performed. On the other hand, if this process is automated, it cannot be easily be (re)configured for various operations.

SUMMARY

According to an embodiment, a reconfigurable fluidic shutter for selectively shielding an antenna array comprises: a first surface and a second surface spaced apart and defining a cavity therebetween; and at least one pump configured to pump a liquid that attenuates electromagnetic radiation into the cavity, out of the cavity, or both; wherein the first and second surfaces are transparent to electromagnetic radiation.

According to another embodiment, an antenna comprises: an antenna array; and a reconfigurable fluidic shutter arranged to selectively shield the antenna array.

According to yet another embodiment, a method of selectively shielding an antenna array comprises: providing a reconfigurable fluidic shutter; and selectively pumping liquid that attenuates electromagnetic radiation into the shutter, out of the shutter, or both.

Other features and advantages of one or more embodiments of the present application will seem apparent from the following detailed description, and accompanying drawings, and the appended claims.

BRIEF DESCRIPTION OF THE DRAWINGS

Embodiments of the present application will now be disclosed, by way of example only, with reference to the accompanying schematic drawings in which corresponding reference symbols indicate corresponding parts, in which:

FIGS. 10a-10c illustrate various views of a reconfigurable fluidic shutter shown in FIG. 9, where

DETAILED DESCRIPTION

In one or more embodiments, a protective enclosure or radome for an antenna array has a reconfigurable fluidic shutter which uses a liquid that attenuates electromagnetic radiation to form a switchable antenna aperture shutter. The reconfigurable fluidic shutter enhances antenna performance and functionality.

In one implementation, the liquid may be a liquefied metal or alloy composition. Although, it will be appreciated that in other implementations various other liquids may also be used to achieve desired affects. For instance, liquids may be loaded with particles that are configured to affect the dielectric constant and thus, affect electromagnetic radiation propagation through the liquid. Exemplary liquids may include organics such as low melt waxes, olefins, and fluorocarbons such as perfluorohexane ($C_6F_{14}$). Additives that affect the dielectric constant thereof may include carbon nanotubes, and organic polymers. These additives adjust the overall dielectric constant of the liquid.

Figure 3:
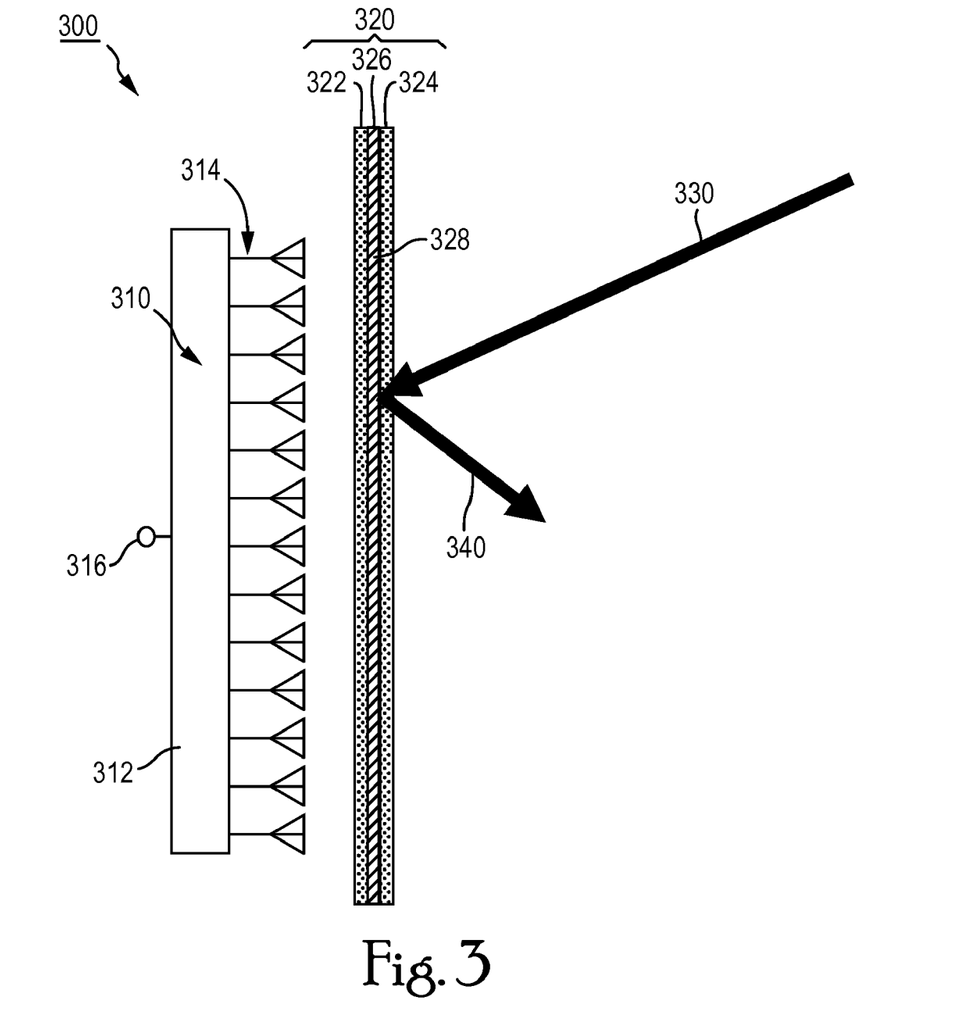
FIG. 3 illustrates an active antenna array assembly having a reconfigurable fluidic shutter according to an embodiment.

FIG. 3 illustrates active antenna array assembly 300 having a reconfigurable fluidic shutter according to an embodiment. The antenna array assembly 300 may be used for many antenna platforms in air, space and ground applications which use radio frequency (RF) radiation. In one implementation, RF electromagnetic waves may be microwaves having frequencies between about 0.3 GHz and 300 GHz. Other forms of electromagnetic radiation are also possible, such as infrared, visible, and ultraviolet light as well as radio waves including long radio waves.

Generally, antenna array assembly 300 includes antenna array 310 and reconfigurable fluidic shutter 320. In some implementations, antenna array 310 may be conventional. Reconfigurable fluidic shutter 320 may be structurally configured to protect antenna array 310 from the environment (e.g., wind, rain, ice, sand, ultraviolet light, etc.).

In one implementation, reconfigurable fluidic shutter 320 generally includes of two dielectric sheets 322, 324 spaced apart and forming a cavity 326 there between. The dielectric sheets 322, 324 may be formed of silicon glass, polished ceramics or other dielectric materials, for example, which may be used for fabricating printed circuit boards. The thickness of the dielectric sheets and cavity may be determined using available electromagnetic modeling software and will depend on the dielectric constant and/or desired frequency of operation.

Liquefied metal 328 may be provided in cavity 326. Liquefied metal 328 may be a liquid or low temperature melting point metal or alloy, which attenuates electromagnetic radiation. As noted above, while liquefied metal is discussed in the disclosed embodiments, it will be appreciated that in other embodiments that other liquid compositions may also be used which affect electromagnetic radiation propagation through the liquid. By using a liquid, the flow conforms to the shape of any cavity, and in multiple dimensions (e.g., along one more of the x, y and z axes).

Liquefied metal 328 may be a fusible alloy. A fusible alloy is an eutectic alloy capable of being fused as well as being a liquid at low temperatures, for example, having a melting point below about 150 C. In addition, melted fusible alloys can provide high thermal conductivity, particularly with alloys made with a high thermal conductivity metal, such as indium or sodium.

Liquefied metal 328 may be readily pumped into cavity 326 to form a metal sheet that covers the antenna aperture to prevent RF signals from entering or leaving the antenna. Likewise, liquefied metal 328 can also be removed from thin cavity by using a pump. Depending on the cavity size and/or shape, one or more small and lightweight pumps may be used to inject and remove the liquefied metal, for example, very rapidly and configured to require minimal power (i.e., less than 0.5 W). For instance, the pump may be a non-magnetofluidynamic (MFD) or electromagnetic induction pump. These pumps have no moving parts and thus, operate nearly vibration-free and with minimal (if any) noise. In some implementations, the pump(s) may be configured to pump liquefied metal 328 at the speed of sound (in an incompressible fluid such as, for example, liquid metal or water) to rapidly fill cavity 326.

Table 1, below, lists a number of metallic and alloy compositions, their melting points and common name, which may be used in accordance with one or more embodiments. These may be referred to broadly, herein, as "liquefied metal." It will be appreciated that the list of composition in Table 1 is not exhaustive, and that other low-temperature melting point metallic and alloy compositions may similarly be used as a liquefied metal.

TABLE 1

Liquefied Metal and Alloy Compositions

| Composition (wt %) | Melting Point (° C.) | Common name |
|---|---|---|
| Cs 77%, K 23.0% | −48 | |
| Hg 100% | −39 | Mercury |
| Ga 68.5%, In 21.5%, Sn 10% | −19 | Galinstan |
| K 78.0%, Na 22.0% | −11 | NaK |
| Ga 62.5%, In 21.5%, Sn 16.0% | 10.7 | |
| Ga 69.8%, In 21.5%, Sn 12.5.0% | 10.8 | |
| Ga 100% | 30 | |
| Bi 40.63%, Pb 22.1%, In 18.1%, Sn 10.65%, Cd 8.2% | 46.5 | |
| Bi 32.5%, In 51.0%, Sn 16.5% | 60.5 | Field's metal |
| Bi 50.0%, Pb 25.0%, Sn 12.50%, Cd 12.5% | 70 | Wood's metal |
| Bi 50.0%, Pb 31.2%, Sn 18.80% | 97 | Newton's metal |
| Bi 50.0%, Pb 28.0%, Sn 22.0% | 109 | Rose's metal |
| Sn 63.0%, Pb 37.0% | 183 | Eutectic solder |
| Sn 92.0%, Zn 8.0% | 199 | Tin Foil |

Although continuous cavity 326 is shown in FIG. 3, it will be appreciated that in other embodiments the cavity may also be configured as a series of thin separate channels which may be filed with one or more liquid metal compositions. The channels keep the compositions from mixing or otherwise interacting. In one such implementation, the channels may be spaced apart less than $\lambda/8$, where $\lambda$ is the wavelength of desired electromagnetic signal to be received and/or transmitted by the antenna array. The channels might also be oriented orthogonal to the polarization of the radiated field (if known). Other orientations of the channels are also possible.

Figure 4:
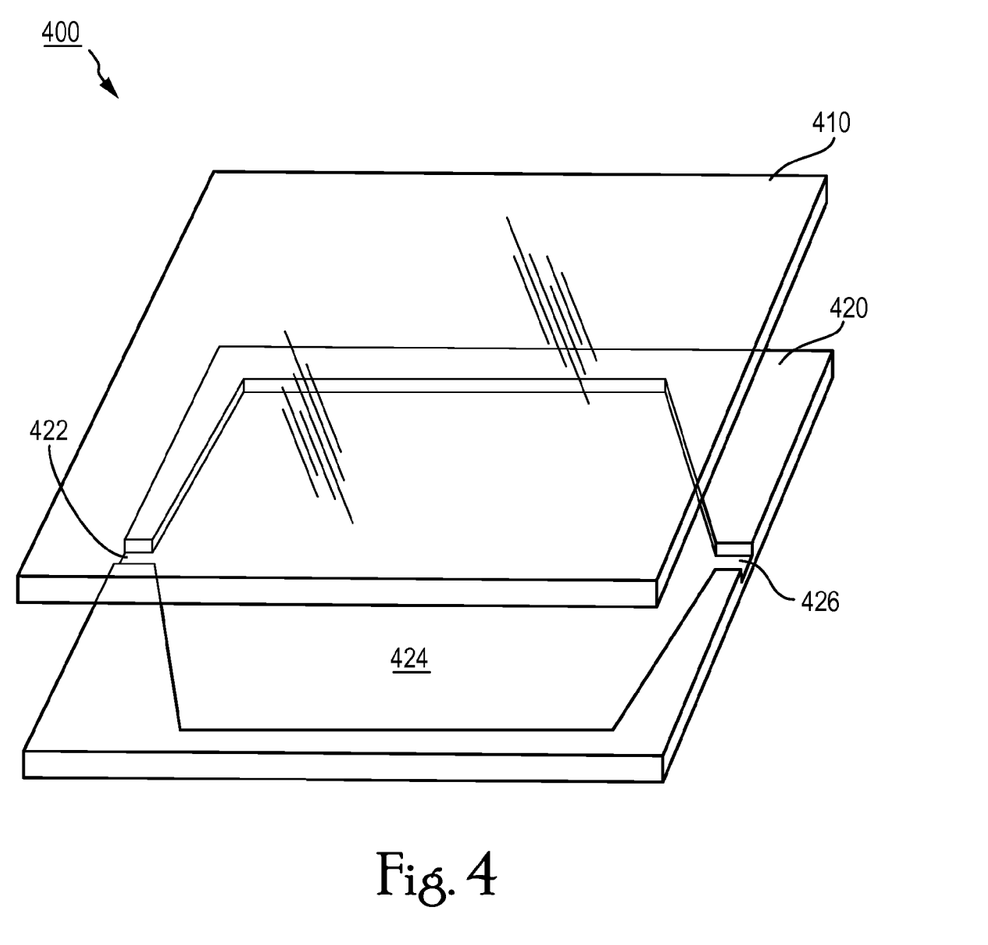
FIG. 4 illustrates the exploded view of a reconfigurable fluidic shutter according to an embodiment.

FIG. 4 illustrates the exploded view of reconfigurable fluidic shutter 400 according to an embodiment. Reconfigurable fluidic shutter 400 may be formed of two dielectric material sheets 410, 420 which are joined together. In some implementations, sheets 410, 420 may be fused together with welds, adhesive, and/or other fasteners. For instance, ultrasonic or friction welding technique may be used to join dielectric material sheets 410, 420. In some implementations, one or more seals may be positioned between sheets 410, 420 to provide a fluid-tight seal therebetween.

At least one inlet 422 and outlet 426 are provided to cavity 424 between sheets 410, 420. As shown, top sheet 410 is generally flat and bottom sheet 420 includes a recessed portion that, when joined, forms cavity 424. Other shapes and configurations of the cavity are also possible. For example, reconfigurable fluidic shutter 400 may be generally curved. Alternatively, reconfigurable fluidic shutter 400 may be formed as a unitary body, for example, by molding or machining cavity 424 therein.

Figure 5:
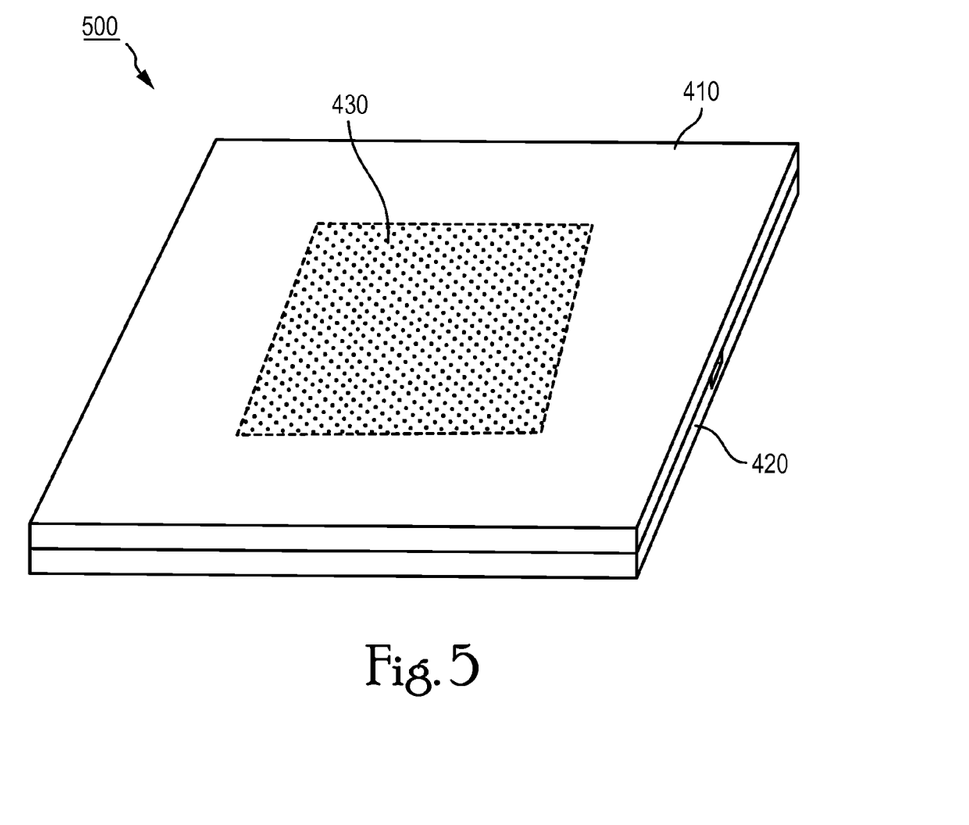
FIG. 5 illustrates the reconfigurable fluidic shutter of FIG. 4 in an assembled state.

FIG. 5 illustrates reconfigurable fluidic shutter 400 of FIG. 4 in an assembled state 500. When in use, field 430 of assembled reconfigurable fluidic shutter 500 may be exposed to electromagnetic radiation. The size of the reconfigurable fluidic shutter may range from the order of about a millimeter squared to over ten meters squared. While inlet and outlet 422, 426 are shown at the sides of shutter 500, it will be appreciated that they may be located at various other locations.

Figure 6:
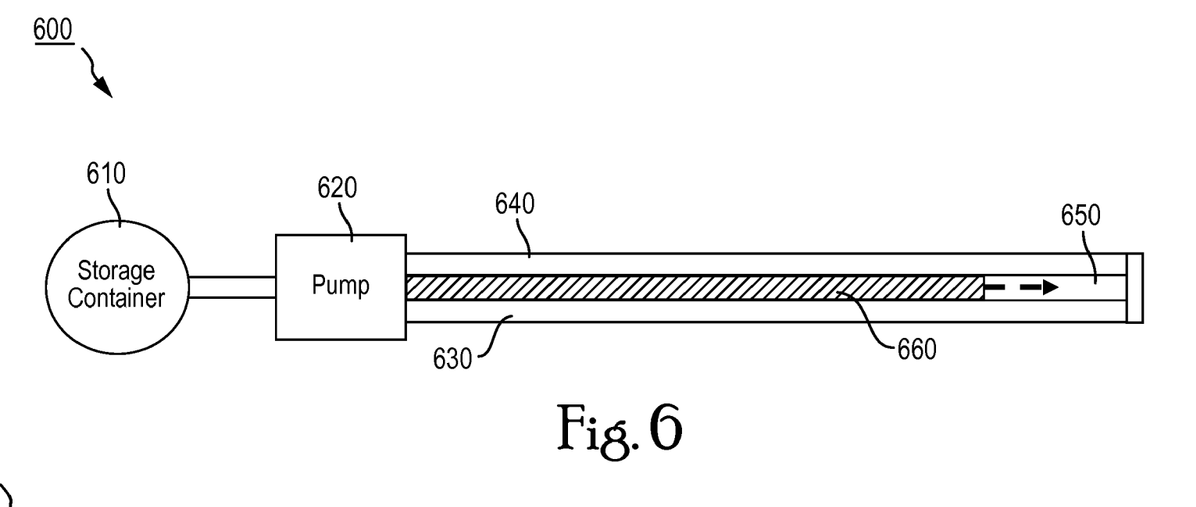
FIG. 6 illustrates a reconfigurable fluidic shutter according to an embodiment.

FIG. 6 illustrates reconfigurable fluidic shutter 600 according to an embodiment. Reconfigurable fluidic shutter 600 may be generally formed of opposed and spaced apart dielectric surfaces 630, 640 which define cavity 650.

Storage container 610 is provided which stores liquefied metal 660. In some implementations, storage container 610 and/or other elements of reconfigurable fluidic shutter 600 may include heating elements (not shown) and/or be insulated to maintain or otherwise provide the metal in a liquid state.

Disposed between storage container 610 and cavity 650 is pump 620 which may be configured to force liquefied metal 660 from storage contain 610 into cavity 650. When it is desired to remove the liquefied metal from cavity 650, pump 620 may be used to return liquefied metal 660 back into storage container 610.

Cavity 650 may be rapidly filled with liquefied metal to prevent electromagnetic radiation from passing through shutter 600. When it is desirable to have radiation pass through shutter 600, pump 620 may rapidly draw liquefied metal 660 from cavity 650 and return it to storage container 610. Accordingly, shutter 600 may be quickly and efficiently switched between modes.

Figure 7:
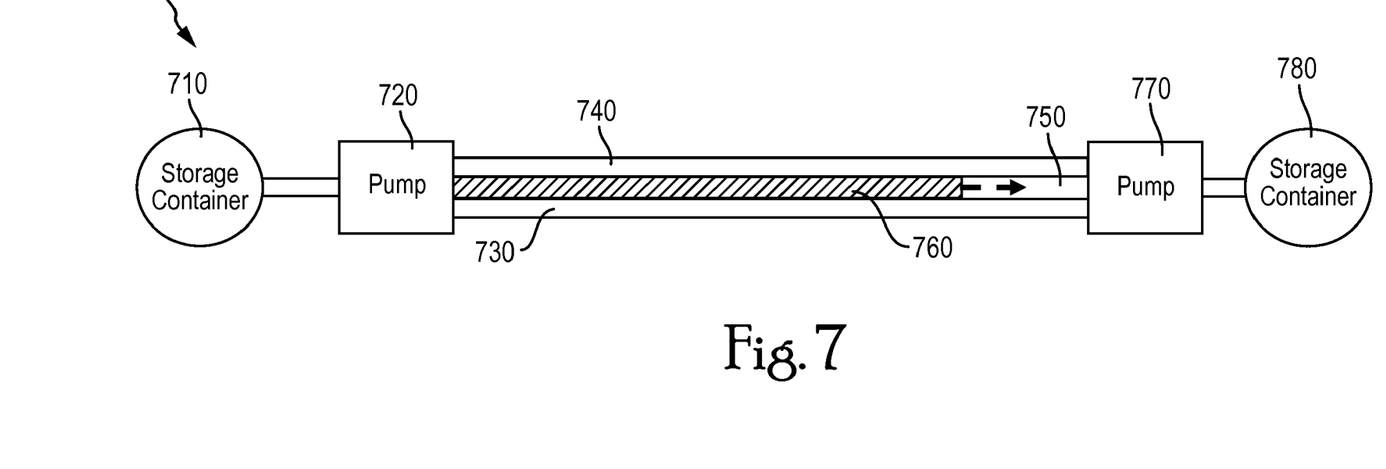
FIG. 7 illustrates a reconfigurable fluidic shutter according to an embodiment.

FIG. 7 illustrates reconfigurable fluidic shutter 700 according to an embodiment. Reconfigurable fluidic shutter 700 is generally formed of opposed and spaced apart dielectric surfaces 730, 740 which define cavity 750. First pump 720 may be configured for pumping liquefied metal 760 from first storage container 710 into cavity 750. In addition, second pump 770 may be provided for pumping liquefied metal from cavity 750 into second storage container 780. Pumps 720 and 770 may be used to control the flow of the liquefied metal into and out of the cavity more quickly than with a single pump. In some implementations, first storage container 710 may be connected to second storage container 780 so that liquefied metal 760 collected in second storage container 780 returns to first storage container 710. Of course, it is contemplated that a single storage container may also be used.

Figure 8A:
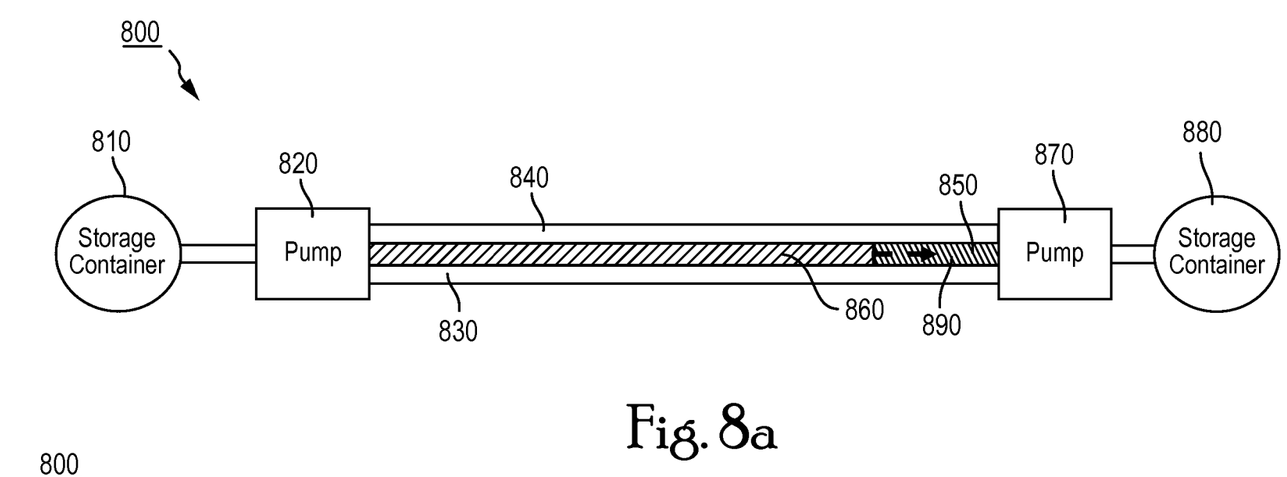
FIGS. 8a and 8b illustrate a reconfigurable fluidic shutter according to an embodiment.
Figure 8B:
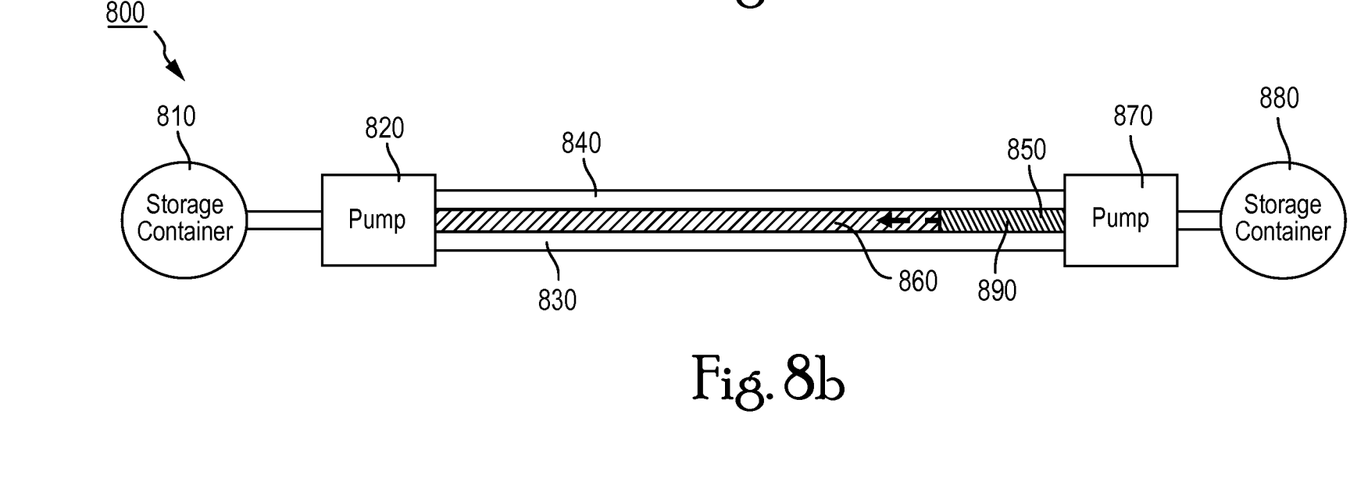

FIGS. 8a and 8b illustrate reconfigurable fluidic shutter 800 according to an embodiment. In this embodiment, multiple compositions may be provided in the cavity. Reconfigurable fluidic shutter 800 is formed of opposed and spaced apart dielectric surfaces 830, 840 which define a cavity 850. First pump 820 may be configured for pumping first composition 860 from first storage container 810 into and out of cavity 850.

Second pump 870 may be provided for pumping second composition 890 from second storage container 880 into and out of cavity 850. One or both of the compositions 860, 890 may be a liquefied metal. In some implementations, one composition may be liquefied metal and other composition could also be a liquid or gas dielectric, such as, for example, air, nitrogen, mineral oil, caster oil, or sulfur hexafluoride.

First and second pumps 820, 870 may be controlled to fill cavity 850 with a different amount of first composition 860 and second composition 890. Accordingly, the attenuation properties of shutter 800 may be selectively controlled at various locations. For instance, portions of shutter 800 may pass (or block) electromagnetic radiation therethrough differently.

While two compositions 860, 890 are illustrated in cavity 850, it will be appreciated that additional compositions could also be similarly pumped into the cavity as well.

Figure 9A:
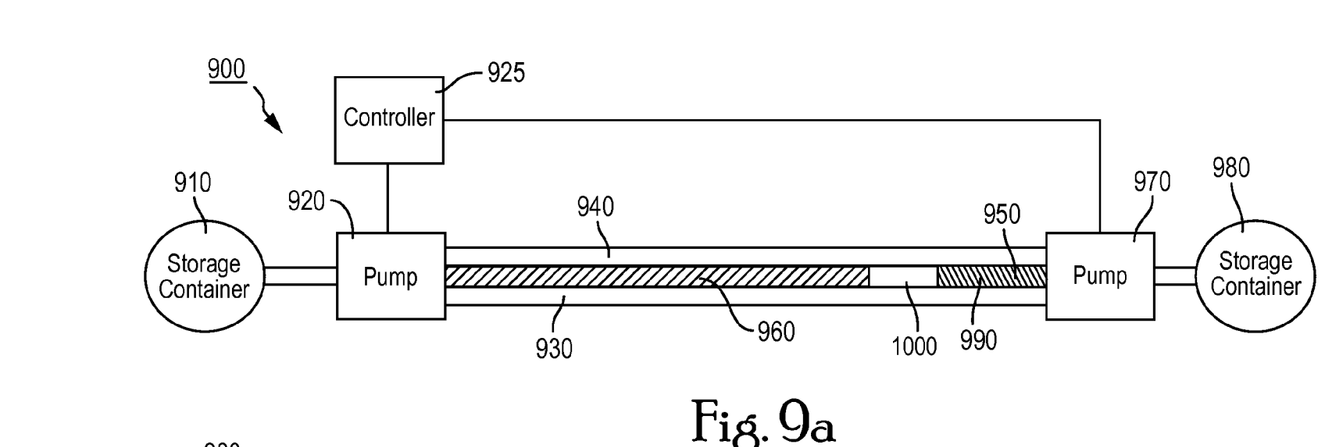
FIGS. 9a and 9b illustrate a reconfigurable fluidic shutter 900 according to an embodiment.
Figure 9B:
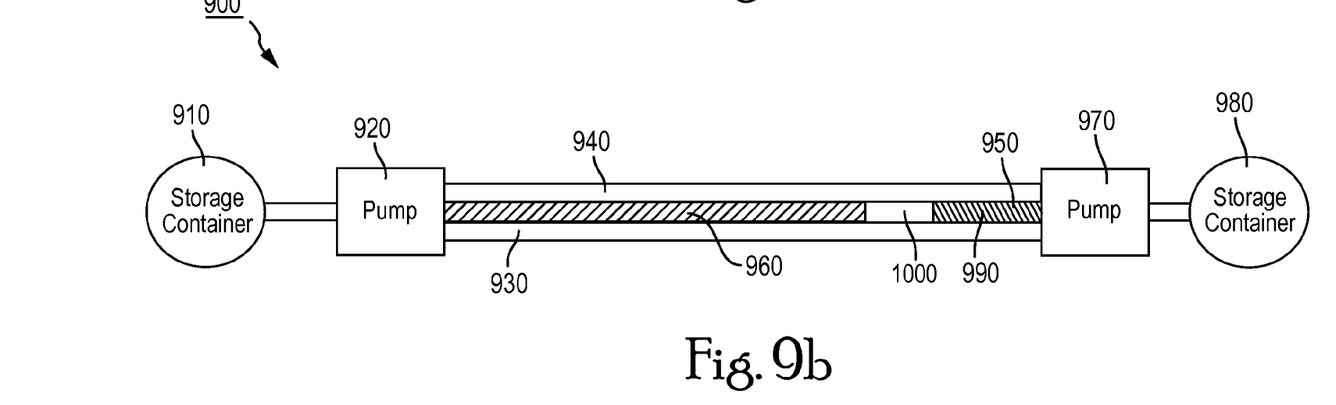

FIGS. 9a and 9b illustrate reconfigurable fluidic shutter 900 according to an embodiment. In this embodiment, multiple compositions may be provided in the cavity. Reconfigurable fluidic shutter 900 is formed of opposed spaced apart dielectric surfaces 930, 940 which define cavity 950. First pump 920 may be configured for pumping first composition 960 from first storage container 910 into and out of the cavity 950.

Second pump 970 may be provided for pumping second composition 990 from second storage container 980 into and out of cavity 950. One or both of the compositions 960, 990 may be a liquefied metal. In some implementations, one composition may be liquefied metal and other composition could also be a liquid or gas dielectric, such as, for example, air, nitrogen, mineral oil, caster oil, or sulfur hexafluoride.

Figure 10A:
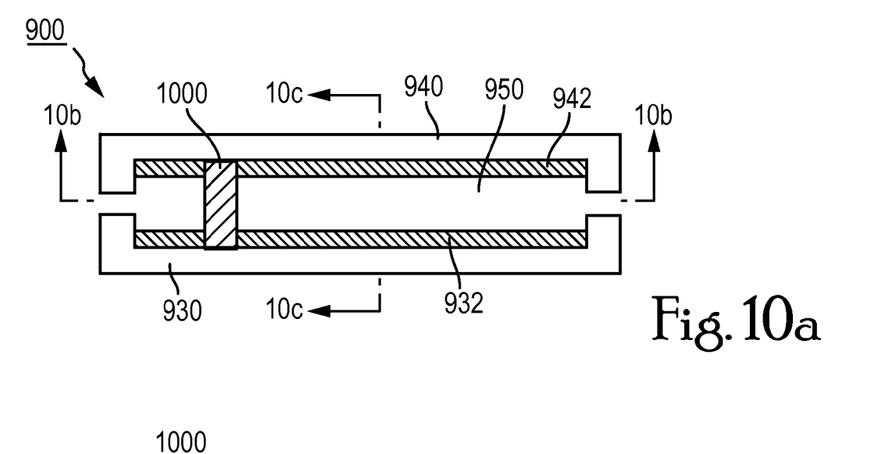
FIG. 10a illustrates a side view of the reconfigurable fluidic shutter 900.
Figure 10B:
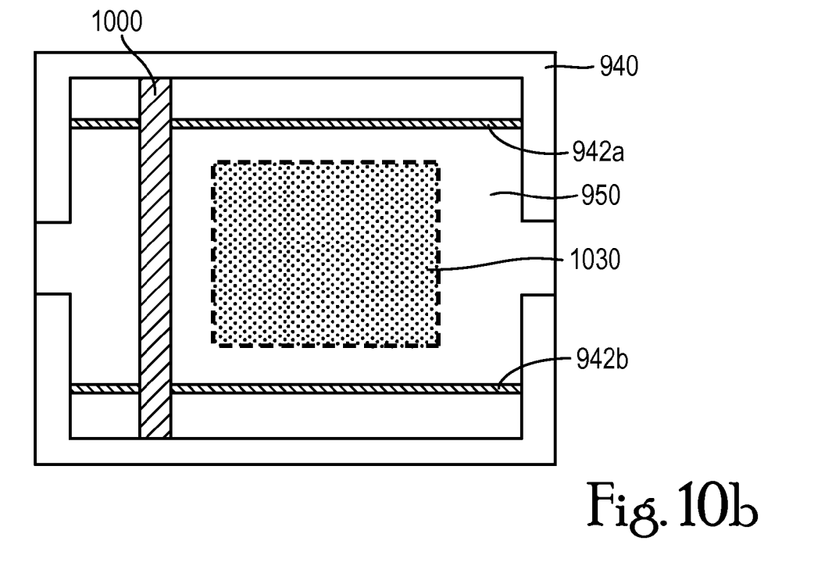
FIG. 10b illustrates a top plan view taken along line 10b-10b.
Figure 10C:
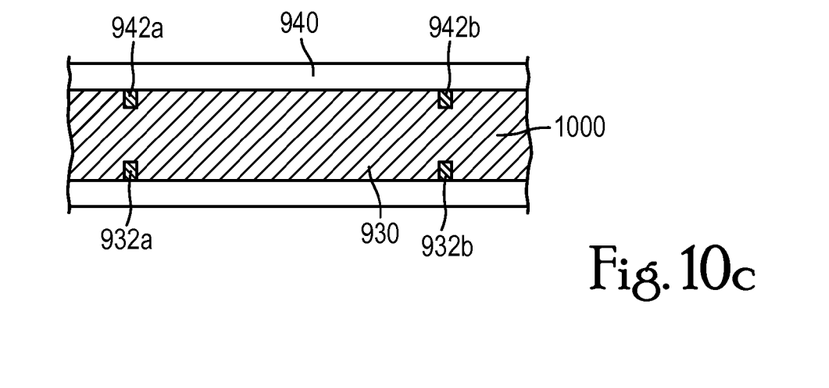
FIG. 10c illustrates a cross-sectional view taken along line 10c-10c.

With reference to FIG. 10, piston 1000 may be located within the cavity 950. Cavity 950 is configured to hold piston 1000 as well as one or both of compositions 960, 990. In some implementations, piston 1000 acts as a barrier to prevent mixing or other interaction between the two compositions within cavity 950. Piston 1000 may have the same height as cavity 950.

In other implementations, piston 1000 is movable with respect to cavity 950 by a reciprocating actuator or motor (not shown), such as by a ball-screw or stepper motor.

FIGS. 10a-10c illustrate various views of reconfigurable fluidic shutter 900 according to an embodiment. For clarity, the pumps and storage containers shown in FIG. 9 have been omitted from these figures.

FIG. 10a illustrates a side view of the reconfigurable fluidic shutter 900. FIG. 10b illustrates a top sectional view taken along line 10b-10b. FIG. 10c illustrates an end cross-sectional view taken along line 10c-10c. To maintain proper alignment, piston 1000 may slide on rails 932a, 932b and 942a, 942b located on top and bottom surfaces 932, 942, respectively, or grooves or slots within the cavity may be used to limit its movement to at least one direction. When in use, a field 1030 of the reconfigurable fluidic shutter may be exposed to electromagnetic radiation.

Figure 11A:
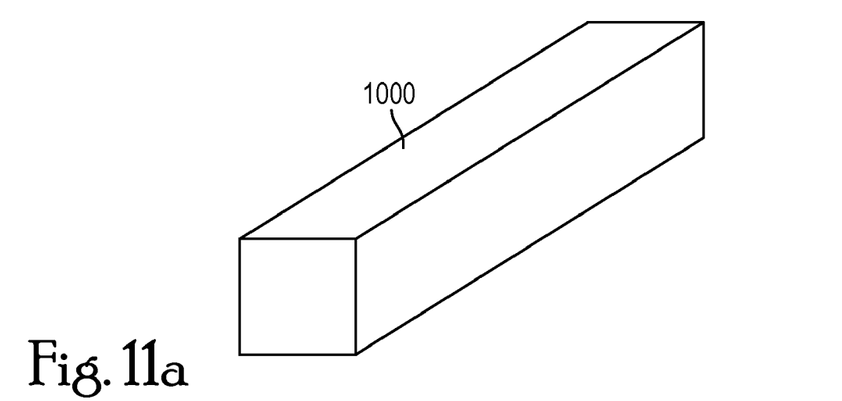
FIGS. 11a-11c illustrate a piston configuration according to various embodiments.
Figure 11B:
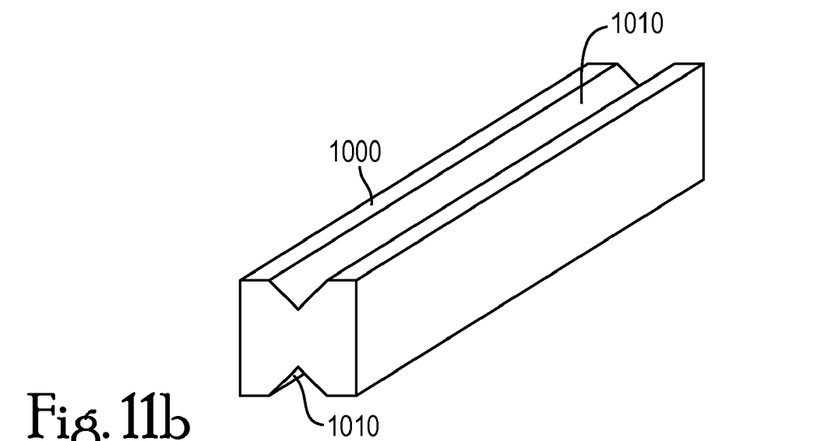
Figure 11C:
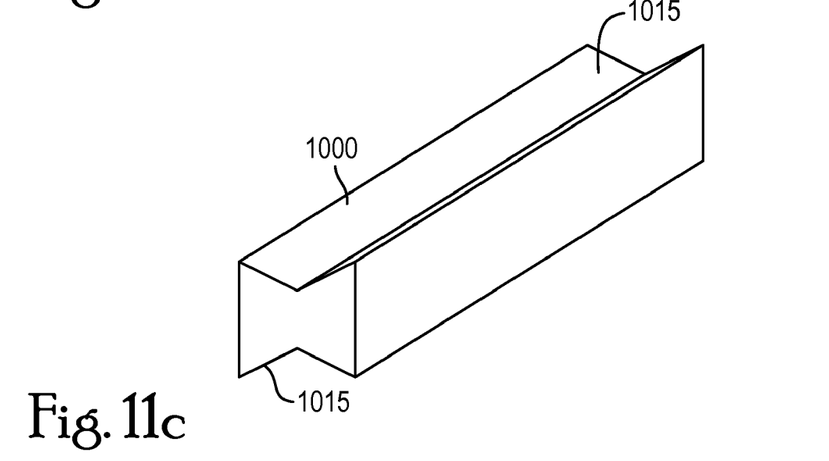

FIGS. 11a-11c illustrate an exemplary cross-sectional view of piston 1000 according to various embodiments. Piston 1000a has a square or rectangular cross-section. Piston 1000b has V-shape slots 1010 at its top and bottom. Similarly, piston 1000c has larger V-shaped slots 1015 at its top and bottom. Of course, it will be appreciated that other configurations of piston 1000 are also possible. For instance, the side surfaces of the piston might include other profiles.

Figure 12:
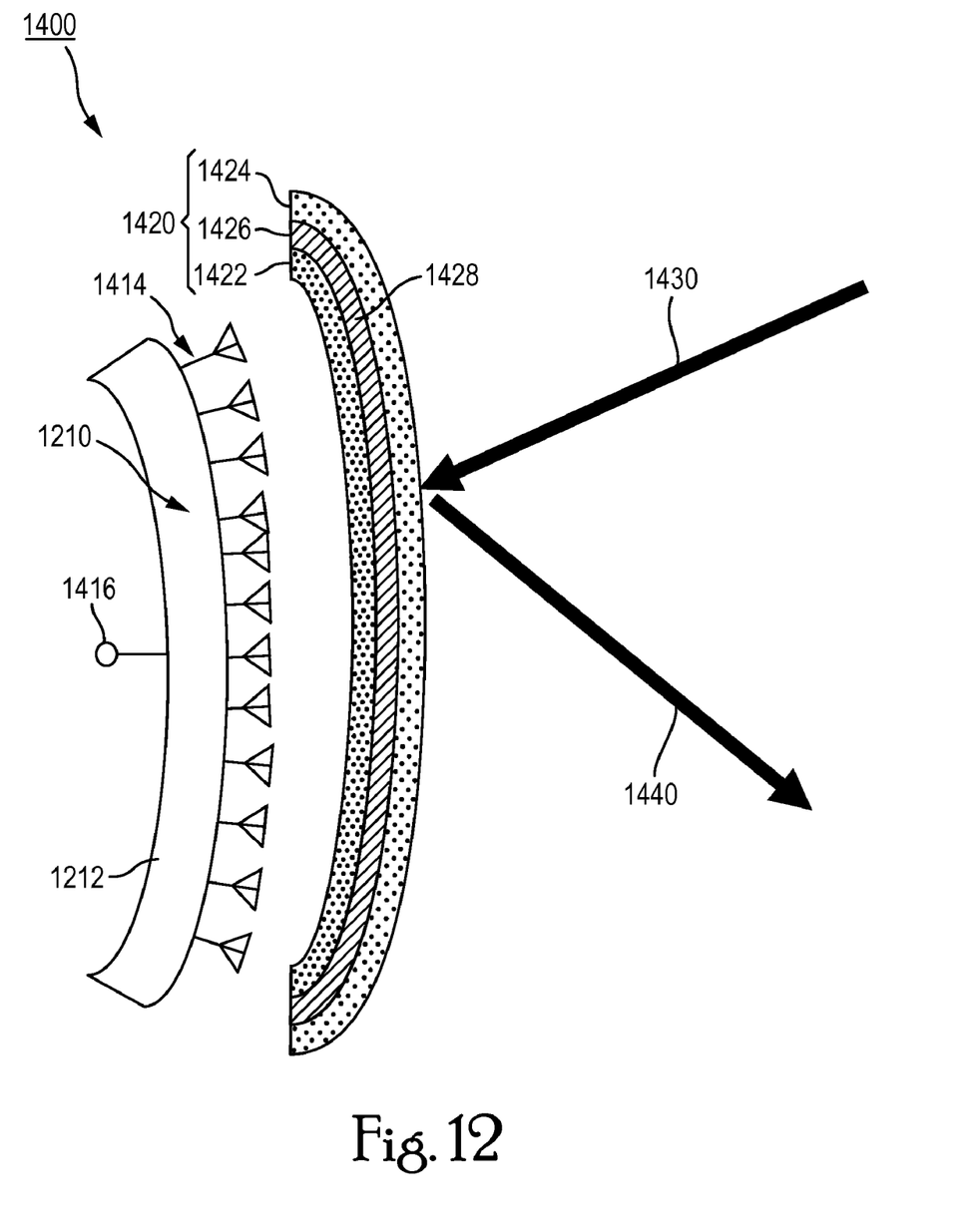
FIG. 12 illustrates an active antenna array assembly having a curved reconfigurable fluidic shutter according to an embodiment.

FIG. 12 illustrates active antenna array assembly 1200 having a curved reconfigurable fluidic shutter according to an embodiment.

Antenna array assembly 1200 includes an antenna array 1210 and a reconfigurable fluidic shutter 1220. The antenna array 1210 in some implementations may be conventional.

The reconfigurable fluidic shutter 1220 generally includes of two dielectric sheets 1222, 1224 spaced apart and forming a cavity 1226 therebetween. The dielectric sheets 1222, 1224 may be formed of silicon glass, polished ceramics or other dielectrical materials which may be used for fabricating printed circuit boards. The thickness of the dielectric sheets and cavity may be calculated using available electromagnetic modeling software, and will depend on the dielectric constant and frequency of operation. Liquefied metal 1228 may be provided in cavity 1226. Liquefied metal 1228 may be a liquid metal or low melting point alloy, such as a fusible allow, which attenuates electromagnetic radiation.

Both antenna array 1210 and shutter 1220 are shown having a curved profile. Of course, it will be appreciated that the shutter may have any shape, including round, square or complex shaped. By using liquefied metal, the metal flows and can conform to the shape of any cavity. Multidimensional and complex shapes are also possible rather than being solely planar (e.g., flat or curved).

A controller (e.g., controller 925 in FIG. 9(a)) may be used to control the reconfigurable fluidic shutter and selectively shield an antenna array by using an appropriate general purpose processor, for example. While controller 325 is shown in FIG. 9a, it will be appreciated that a controller may be provided in the other embodiments, as well, to control the various elements and operations thereof.

While this disclosure has been described in connection with what is presently considered to be the most practical embodiments, it is to be understood that it is capable of further modifications and is not to be limited to the disclosed embodiments, and this application is intended to cover any variations, uses, equivalent arrangements or adaptations of the disclosure following, in general, the principles of the disclosure and including such departures from the present disclosure as come within known or customary practice in the art to which the application pertains, and as may be applied to the essential features hereinbefore set forth and followed in the spirit and scope of the appended claims.

What is claimed is:

1. A reconfigurable fluidic shutter for selectively shielding an antenna array comprising:
    a first surface and a second surface spaced apart and defining a cavity therebetween; and
    at least one pump configured to pump a liquid that attenuates electromagnetic radiation into the cavity, out of the cavity, or both;
    wherein the first and second surfaces are transparent to electromagnetic radiation.

2. The shutter according to claim 1, further comprising:
    a storage container configured to store the liquid.

3. The shutter according to claim 1, wherein the first and second surfaces are curved.

4. The shutter according to claim 1, wherein the first and second surfaces are planar.

5. The shutter according to claim 1, wherein the at least one pump comprises first and second pumps, the first pump configured to pump the liquid into the cavity, out of the cavity, or both; and
    the second pump configured to pump a gas or liquefied dielectric composition into the cavity, out of the cavity, or both.

6. The shutter according to claim 5, further comprising:
    a second storage container configured to store the gas or liquefied dielectric composition.

7. The shutter according to claim 5, further comprising:
    a piston configured to be moved within the cavity; and
    an actuator or motor configured to move the piston.

8. The shutter according to claim 7, wherein the piston is configured to prevent the liquid and the liquefied dielectric from mixing or interacting.

9. The shutter according to claim 7, further comprising:
    at least one rail in the cavity upon which the piston slides along.

10. The shutter according to claim 1, wherein the liquid comprises particles configured to affect the dielectric properties thereof and electromagnetic radiation propagation through the liquid.

11. The shutter according to claim 10, wherein the liquid is selected from the group consisting of: low-melt waxes, olefins, and fluorocarbons.

12. The shutter according to claim 10, wherein the particles are selected from the group consisting of: carbon nanotubes, and organic polymers.

13. The shutter according to claim 1, wherein the liquid comprises a liquefied metal or alloy composition.

14. The shutter according to claim 13, wherein the liquefied metal or alloy composition is selected from the group consisting of: Cs 77%, K 23.0%; Hg 100%; Ga 68.5%, In 21.5%, Sn 10%; K 78.0%, Na 22.0%; Ga 62.5%, In 21.5%, Sn 16.0%; Ga 69.8%, In 21.5%, Sn 12.5.0%; Ga 100%; Bi 40.63%, Pb 22.1%, In 18.1%, Sn 10.65%, Cd 8.2%; Bi 32.5%, In 51.0%, Sn 16.5%; Bi 50.0%, Pb 25.0%, Sn 12.50%, Cd 12.5%; Bi 50.0%, Pb 31.2%, Sn 18.80%; Bi 50.0%, Pb 28.0%, Sn 22.0%; Sn 63.0%, Pb 37.0%; and Sn 92.0%, Zn 8.0%.

15. The shutter according to claim 1, wherein the cavity comprises a plurality of channels.

16. The shutter according to claim 15, wherein the channels are spaced apart less than $\lambda/8$, where $\lambda$ is a wavelength of a desired electromagnetic signal to be received and/or transmitted by the antenna array.

17. The shutter according to claim 15, wherein the channels are oriented orthogonal to a polarization of a radiated field.

18. The shutter according to claim 1, further comprising:
    heating elements and/or insulation to maintain the liquid in a liquid state.

19. The shutter according to claim 1, wherein the at least one pump is configured to inject the liquid into the cavity, to remove the liquid from the cavity, or both, at around the speed of sound in an uncompressible liquid.

20. An antenna comprising:
    an antenna array; and
    a shutter according to claim 1 arranged to selectively shield the antenna array.

21. A method of selectively shielding an antenna array comprising:
    providing the shutter of claim 1; and
    selectively pumping liquid that attenuates electromagnetic radiation into the shutter, out of the shutter, or both.

* * * * *